(12) United States Patent  
Marra et al.

(10) Patent No.: US 8,970,307 B2
(45) Date of Patent: Mar. 3, 2015

(54) BIAS CURRENT MONITOR AND CONTROL MECHANISM FOR AMPLIFIERS

(71) Applicant: QUALCOMM Incorporated, San Diego, CA (US)

(72) Inventors: Thomas Domenick Marra, San Diego, CA (US); Aristotele Hadjichristos, San Diego, CA (US); Nathan M Pletcher, Mountain View, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/741,571

(22) Filed: Jan. 15, 2013

(65) Prior Publication Data

US 2013/0127545 A1 May 23, 2013

Related U.S. Application Data

(62) Division of application No. 12/704,432, filed on Feb. 11, 2010.

(60) Provisional application No. 61/230,089, filed on Jul. 30, 2009.

(51) Int. Cl.
*H03G 3/10* (2006.01)
*H03F 3/68* (2006.01)

(52) U.S. Cl.
USPC ............. 330/285; 330/127; 330/136; 330/85; 330/291

(58) Field of Classification Search
USPC .............................. 330/285, 127, 136, 85, 291
IPC .............................. H30G 3/10,3/20; H03F 3/68
See application file for complete search history.

(56) References Cited

U.S. PATENT DOCUMENTS

| 5,406,225 | A | 4/1995 | Iida et al. |
| 5,426,641 | A | 6/1995 | Afrashteh et al. |
| 5,548,248 | A | 8/1996 | Wang |
| 6,025,754 | A | 2/2000 | Czora |

(Continued)

FOREIGN PATENT DOCUMENTS

| CN | 1613178 A | 5/2005 |
| CN | 101263652 A | 9/2008 |

(Continued)

OTHER PUBLICATIONS

Co-pending U.S. Appl. No. 08/037,764, filed Mar. 26, 1993.

(Continued)

*Primary Examiner* — Patricia Nguyen
(74) *Attorney, Agent, or Firm* — Ramin Mobarhan

(57) ABSTRACT

Techniques for monitoring and controlling bias current of amplifiers are described. In an exemplary design, an apparatus may include an amplifier and a bias circuit. The amplifier may include at least one transistor coupled to an inductor. The bias circuit may generate at least one bias voltage for the at least one transistor in the amplifier to obtain a target bias current for the amplifier. The bias circuit may generate the at least one bias voltage based on a voltage across the inductor in the amplifier, or a current through a current mirror formed with one of the at least one transistor in the amplifier, or a gate-to-source voltage of one of the at least one transistor in the amplifier, or a voltage in a replica circuit replicating the amplifier, or a current applied to the amplifier with a switched mode power supply disabled.

19 Claims, 8 Drawing Sheets

(56) References Cited

U.S. PATENT DOCUMENTS

| | | | |
|---|---|---|---|
| 6,046,642 A | 4/2000 | Brayton et al. | |
| 6,091,302 A | 7/2000 | Arevalo | |
| 6,114,912 A | 9/2000 | Ashby et al. | |
| 6,178,313 B1 | 1/2001 | Mages et al. | |
| 6,300,837 B1 | 10/2001 | Sowlati et al. | |
| 6,333,677 B1 | 12/2001 | Dening | |
| 6,392,492 B1 | 5/2002 | Yuan | |
| 6,411,166 B2 | 6/2002 | Baschirotto et al. | |
| 6,614,309 B1 | 9/2003 | Pehlke | |
| 6,664,856 B2 | 12/2003 | Schaffer | |
| 6,778,016 B2 | 8/2004 | Luo | |
| 6,803,822 B2 | 10/2004 | Kim et al. | |
| 6,825,726 B2 | 11/2004 | French et al. | |
| 6,838,932 B2 | 1/2005 | Izumiyama et al. | |
| 6,891,438 B2 | 5/2005 | Arai et al. | |
| 7,084,706 B2 | 8/2006 | Minichshofer | |
| 7,091,772 B2 | 8/2006 | Friedel et al. | |
| 7,106,388 B2 * | 9/2006 | Vorenkamp et al. | 348/726 |
| 7,113,044 B2 * | 9/2006 | Wang | 330/288 |
| 7,116,174 B2 | 10/2006 | Fang et al. | |
| 7,196,584 B2 | 3/2007 | Harris | |
| 7,202,736 B1 | 4/2007 | Dow et al. | |
| 7,315,152 B1 | 1/2008 | Epperson et al. | |
| 7,340,228 B2 | 3/2008 | Monroe et al. | |
| 7,365,604 B2 | 4/2008 | Luo et al. | |
| 7,415,253 B2 | 8/2008 | Carter et al. | |
| 7,576,598 B2 * | 8/2009 | Marinca | 327/539 |
| 7,612,613 B2 | 11/2009 | Kang et al. | |
| 7,692,468 B1 * | 4/2010 | Ellersick | 327/315 |
| 7,760,026 B2 | 7/2010 | Young et al. | |
| 7,911,279 B2 | 3/2011 | Chow et al. | |
| 7,969,195 B1 * | 6/2011 | Fortin et al. | 326/83 |
| 8,131,232 B2 | 3/2012 | Muhammad | |
| 8,319,549 B2 * | 11/2012 | Sengupta et al. | 330/2 |
| 2002/0125954 A1 | 9/2002 | Luo et al. | |
| 2003/0102924 A1 | 6/2003 | Matsumoto et al. | |
| 2003/0137355 A1 | 7/2003 | Lin | |
| 2004/0070454 A1 | 4/2004 | Henderson et al. | |
| 2004/0130392 A1 | 7/2004 | Saito | |
| 2004/0263256 A1 | 12/2004 | Ishikawa et al. | |
| 2006/0033577 A1 | 2/2006 | Nakamizo et al. | |
| 2006/0066410 A1 | 3/2006 | Razavi et al. | |
| 2006/0192619 A1 | 8/2006 | Hoffmann et al. | |
| 2007/0008038 A1 | 1/2007 | Klepser et al. | |
| 2007/0057728 A1 | 3/2007 | Autti | |
| 2008/0143445 A1 | 6/2008 | Nakamura et al. | |
| 2009/0115526 A1 | 5/2009 | Honda et al. | |
| 2009/0153248 A1 | 6/2009 | Sun et al. | |
| 2011/0025422 A1 | 2/2011 | Marra et al. | |
| 2013/0127546 A1 | 5/2013 | Marra et al. | |
| 2013/0229235 A1 | 9/2013 | Ohnishi | |

FOREIGN PATENT DOCUMENTS

| | | |
|---|---|---|
| DE | 19851718 A1 | 11/1999 |
| EP | 0385641 A2 | 9/1990 |
| EP | 1376855 A2 | 1/2004 |
| EP | 1693958 A1 | 8/2006 |
| EP | 1855379 A1 | 11/2007 |
| GB | 2301248 A | 11/1996 |
| GB | 2448525 A | 10/2008 |
| JP | 9307369 A | 11/1997 |
| JP | 10290129 A | 10/1998 |
| JP | 2000349568 A | 12/2000 |
| JP | 2001284984 A | 10/2001 |
| JP | 2005123860 A | 5/2005 |
| JP | 2005526412 A | 9/2005 |
| JP | 2005303401 A | 10/2005 |
| JP | 2007013792 A | 1/2007 |
| JP | 2007074039 A | 3/2007 |
| WO | 02097971 A1 | 12/2002 |
| WO | 03012980 A1 | 2/2003 |
| WO | 03049279 A1 | 6/2003 |
| WO | 2004070941 A2 | 8/2004 |
| WO | 2007004673 A1 | 1/2007 |
| WO | 2007031594 A1 | 3/2007 |
| WO | 2008128706 A1 | 10/2008 |

OTHER PUBLICATIONS

Chin-Leong Lim, "0.5 W High Linearity Power Amplifier for Broadband Wireless (3.3~3.9 GHz)", Microwave Conference, 2007. KJMW 2007. Korea-Japan Nov. 15-16, 2007 pp. 9-12.

International Search Report and Written Opinion—PCT/US2010/044033—ISA/EPO—Apr. 28, 2011.

* cited by examiner

BIAS CURRENT MONITOR AND CONTROL MECHANISM FOR AMPLIFIERS

CLAIM OF PRIORITY UNDER 35 U.S.C. §120

The present Application for Patent is a divisional of patent application Ser. No. 12/704,432, entitled "BIAS CURRENT MONITOR AND CONTROL MECHANISM FOR AMPLIFIERS" filed Feb. 11, 2010, pending, which claims priority to Provisional Application No. 61/230,089, entitled "POWER AMPLIFIER BIAS CURRENT MONITOR AND CONTROL MECHANISM," filed Jul. 30, 2009, and assigned to the assignee hereof and hereby expressly incorporated by reference herein.

BACKGROUND

I. Field

The present disclosure relates generally to electronics, and more specifically to biasing circuits for amplifiers.

II. Background

Amplifiers are commonly used in various electronic devices to provide signal amplification. Different types of amplifiers are available for different uses. For example, a wireless communication device such as a cellular phone may include a transmitter and a receiver for bi-directional communication. The transmitter may include a driver amplifier (DA) and a power amplifier (PA), the receiver may include a low noise amplifier (LNA), and the transmitter and receiver may include variable gain amplifiers (VGAs).

An amplifier may be designed to operate with a target bias current, which may be selected based on the desired performance of the amplifier. The target bias current may be obtained by applying a suitable bias voltage to the amplifier. This bias voltage may be fixed and may then result in a bias current that may vary with aging of the amplifier, temperature, and other phenomena. The bias current may thus deviate from the target bias current, and the deviation may adversely impact the performance of the amplifier. For example, a lower or higher bias current may cause the output power of the amplifier to shift, which may be undesirable.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for monitoring and controlling the bias current of amplifiers are described herein. The techniques may be used for various electronic devices such as wireless communication devices, cellular phones, personal digital assistants (PDAs), handheld devices, wireless modems, laptop computers, cordless phones, Bluetooth devices, consumer electronic devices, etc. For clarity, the use of the techniques for a wireless communication device is described below.

Figure 1:
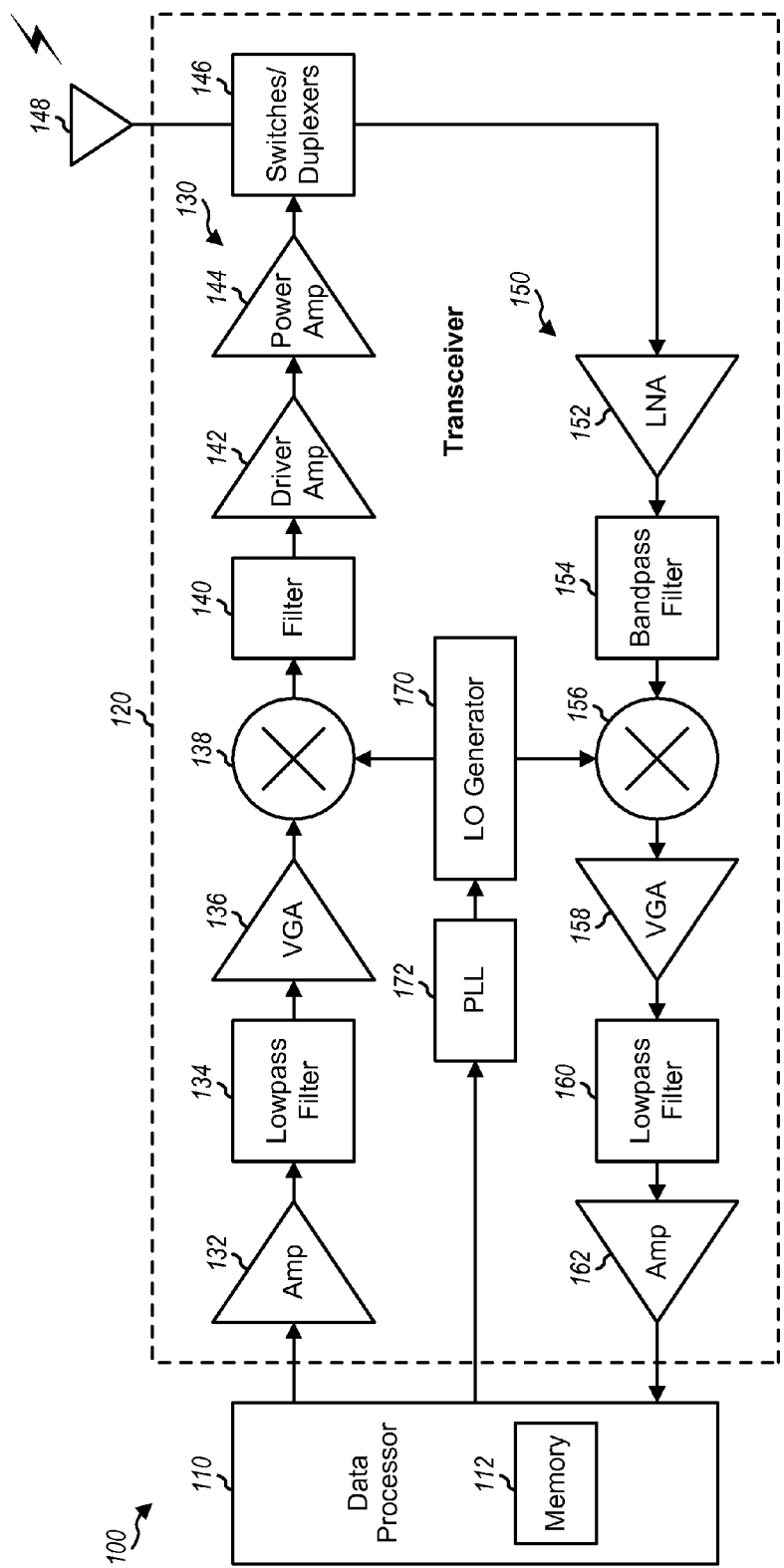
FIG. 1 shows a block diagram of a wireless communication device.

FIG. 1 shows a block diagram of an exemplary design of a wireless communication device 100. In this exemplary design, wireless device 100 includes a data processor 110 and a transceiver 120. Transceiver 120 includes a transmitter 130 and a receiver 150 that support bi-directional wireless communication. In general, wireless device 100 may include any number of transmitters and any number of receivers for any number of communication systems and any number of frequency bands.

In the transmit path, data processor 110 processes data to be transmitted and provides an analog output signal to transmitter 130. Within transmitter 130, the analog output signal is amplified by an amplifier (Amp) 132, filtered by a lowpass filter 134 to remove images caused by digital-to-analog conversion, amplified by a VGA 136, and upconverted from baseband to radio frequency (RF) by a mixer 138. The upconverted signal is filtered by a filter 140, further amplified by a driver amplifier (DA) 142 and a power amplifier (PA) 144, routed through switches/duplexers 146, and transmitted via an antenna 148.

In the receive path, antenna 148 receives signals from base stations and/or other transmitter stations and provides a received signal, which is routed through switches/duplexers 146 and provided to receiver 150. Within receiver 150, the received signal is amplified by an LNA 152, filtered by a bandpass filter 154, and downconverted from RF to baseband by a mixer 156. The downconverted signal is amplified by a VGA 158, filtered by a lowpass filter 160, and amplified by an amplifier 162 to obtain an analog input signal, which is provided to data processor 110.

FIG. 1 shows transmitter 130 and receiver 150 implementing a direct-conversion architecture, which frequency converts a signal between RF and baseband in one stage. Transmitter 130 and/or receiver 150 may also implement a superheterodyne architecture, which frequency converts a signal between RF and baseband in multiple stages. A local oscillator (LO) generator 170 generates and provides transmit and receive LO signals to mixers 138 and 156, respectively. A phase locked loop (PLL) 172 receives control information from data processor 110 and provides control signals to LO generator 170 to generate the transmit and receive LO signals at the proper frequencies.

FIG. 1 shows an exemplary transceiver design. In general, the conditioning of the signals in transmitter 130 and receiver 150 may be performed by one or more stages of amplifier, filter, mixer, etc. These circuits may be arranged differently from the configuration shown in FIG. 1. Furthermore, other circuits not shown in FIG. 1 may also be used to condition the signals in the transmitter and receiver. Some circuits in FIG. 1 may also be omitted. All or a portion of transceiver 120 may be implemented on one or more analog integrated circuits (ICs), RF ICs (RFICs), mixed-signal ICs, etc. For example, amplifier 132 through power amplifier 144 in transmitter 130 may be implemented on an RFIC. Driver amplifier 142 and power amplifier 144 may also be implemented on another IC external to the RFIC.

Data processor 110 may perform various functions for wireless device 100, e.g., processing for transmitted and received data. A memory 112 may store program codes and data for data processor 110. Data processor 110 may be implemented on one or more application specific integrated circuits (ASICs) and/or other ICs.

The techniques for monitoring and controlling bias current described herein may be used for various types of amplifiers, such as the amplifiers shown in FIG. 1. For clarity, much of the description below covers monitoring and controlling bias current of a power amplifier, e.g., power amplifier 144 in FIG. 1. The techniques can measure the bias current of the power amplifier and can adjust the bias current to compensate for bias changes due to aging, and variations in IC process, power supply voltage, temperature, and/or other phenomena.

Figure 2:
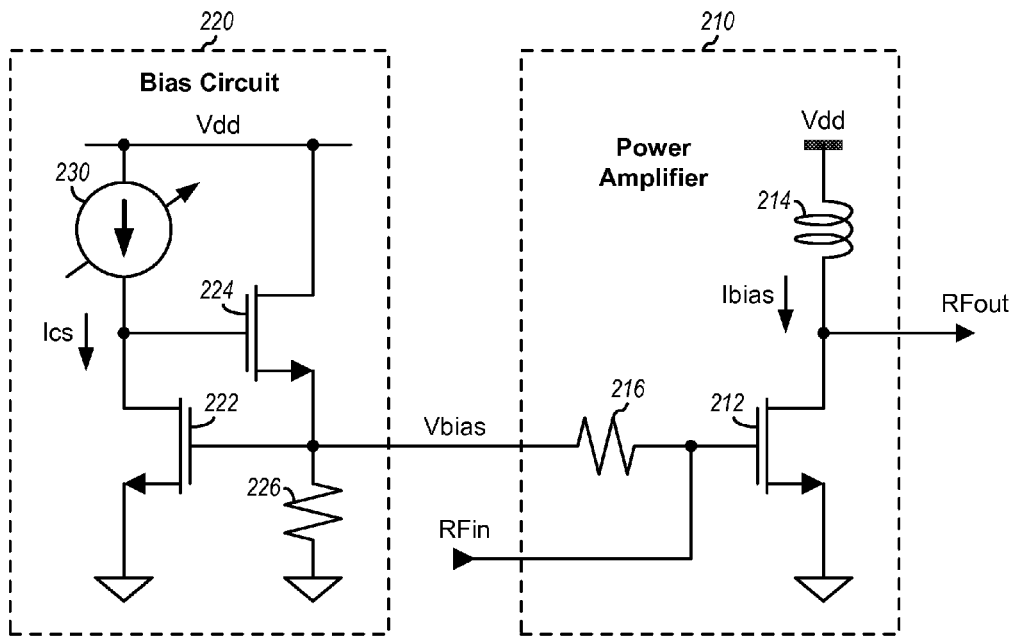
FIG. 2 shows an exemplary design of bias adjustment for a power amplifier using a current mirror.

FIG. 2 shows a schematic diagram of an exemplary design of bias adjustment using a current mirror. In the exemplary design shown in FIG. 2, a power amplifier 210 is implemented with an N-channel metal oxide semiconductor (NMOS) transistor 212 coupled to an inductor 214. NMOS transistor 212 has its gate receiving an input RF (RFin) signal, its source coupled to circuit ground, and its drain providing an output RF (RFout) signal. Inductor 214 has one end coupled to an upper power supply, Vdd, and the other end coupled to the drain of NMOS transistor 212. A resistor 216 has one end coupled to the gate of NMOS transistor 212 and the other end receiving a bias voltage, Vbias, from a bias circuit 220.

NMOS transistor 212 provides signal amplification for the RFin signal. Inductor 214 acts as a passive load for NMOS transistor 212. Inductor 214 also acts as an RF choke that reduces noise coupling from the Vdd supply to the RFout signal. Inductor 214 may also be part of an output matching circuit for power amplifier 210. Resistor 216 acts as an RF choke that can deliver the Vbias voltage to NMOS transistor 212 while providing a high impedance path to the RFin signal.

Within bias circuit 220, an NMOS transistor 222 has its source coupled to circuit ground and its gate coupled to resistor 216. A current source 230 has one end coupled to the drain of NMOS transistor 222 and the other end coupled to Vdd. Current source 230 may be a programmable current source that can provide a variable current, Ics. An NMOS transistor 224 has its source coupled to the gate of NMOS transistor 222, its gate coupled to the drain of NMOS transistor 222, and its drain coupled to Vdd. A resistor 226 is coupled between the gate of NMOS transistor 222 and circuit ground.

Power amplifier 210 has a bias current of Ibias, which flows through inductor 214 and NMOS transistor 212. The Ibias current may be selected to provide the desired performance for power amplifier 210. The Ibias current is dependent on the Vbias voltage provided to the gate of NMOS transistor 212. A desired/target Ibias current may be obtained by setting the Vbias voltage to a suitable value. However, different Vbias voltages may be needed to obtain the target Ibias current due to various factors such as aging of NMOS transistor 212, temperature, power supply voltage, and IC process variations, etc.

Bias circuit 220 and power amplifier 210 are coupled as a current mirror. The same Vbias voltage is applied to the gates of both NMOS transistors 212 and 222. The Ibias current through NMOS transistor 212 is thus related to the Ics current through NMOS transistor 222 and may be expressed as:

$$Ibias = K \cdot Ics, \qquad \text{Eq (1)}$$

where K is the ratio of the size of NMOS transistor 212 to the size of NMOS transistor 222. K may be greater than one so that only a fraction of the Ibias current is used for bias circuit 220, which may then reduce power consumption.

The exemplary design shown in FIG. 2 relies on matching between NMOS transistor 212 in power amplifier 210 and NMOS transistor 222 in bias circuit 220 to obtain the relationship between Ibias and Ics shown in equation (1). To obtain the target Ibias current, a corresponding target Ics current may be computed as Ics=Ibias/K. Current source 230 may then be adjusted to provide the target Ics current.

Although not shown in FIG. 2, the Ics current may also be measured, and current source 230 may be controlled to obtain the target Ics current. This may ensure that the target Ibias current is provided to power amplifier 210. Since the Ibias current is a scaled version of the Ics current, the Ibias current may be effectively measured via the current mirror. This would avoid the need to add a resistor in series with inductor 214 in order to measure the Ibias current, which would in turn avoid a voltage drop between Vdd and NMOS transistor 212.

In one exemplary design, the bias adjustment may be performed based on a look-up table of Vbias voltage versus measured Ics current. This look-up table may be determined by characterizing power amplifier 210 via computer simulation, empirical measurements, etc. The measured Ics current may be provided to the look-up table, which may then provide the Vbias voltage for NMOS transistor 212. In another exemplary design, the bias adjustment may be performed iteratively. For each iteration, the measured Ics current may be compared against the target Ics current. If the measured Ics current is not within an acceptable range of the target Ics current, then the Vbias voltage may be adjusted such that the measured Ics current moves closer toward the target Ics current. The bias adjustment may terminate when the measured Ics current is within the acceptable range of the target Ics current.

Figure 3:
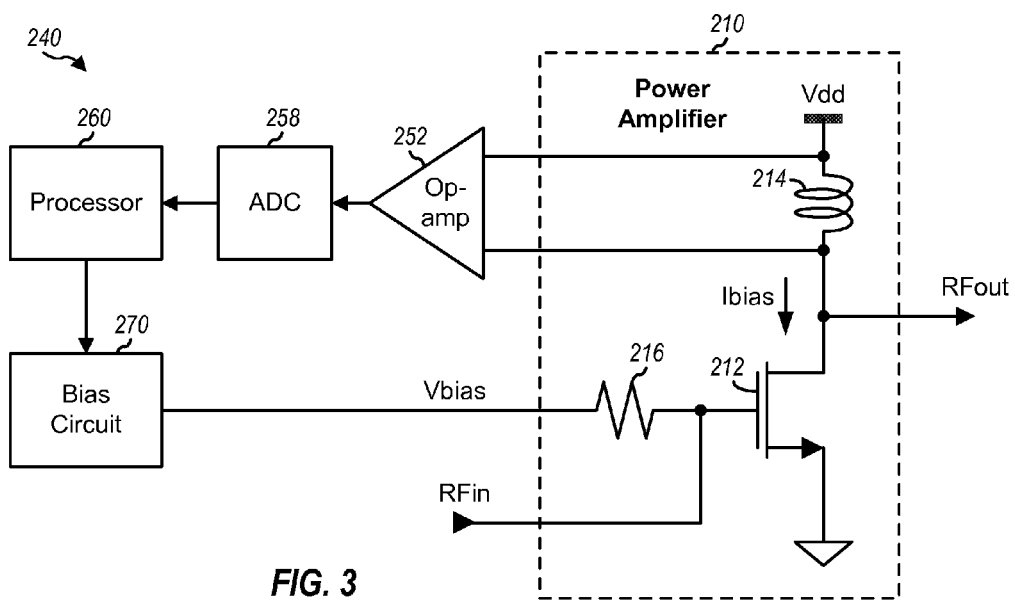
FIG. 3 shows an exemplary design of bias adjustment based on a voltage across an inductor in a power amplifier.

FIG. 3 shows a schematic diagram of an exemplary design of bias adjustment by measuring a voltage across inductor 214. In the exemplary design shown in FIG. 3, a bias adjustment circuit 240 includes an operational amplifier (op-amp) 252, an analog-to-digital-converter (ADC) 258, a processor 260, and a bias circuit 270. Op-amp 252 has its two inputs coupled to the two ends of inductor 214 and its output coupled to ADC 258. Processor 260 receives the digital output from ADC 258 and controls bias circuit 270 to generate a desired bias voltage, Vbias, which is provided to resistor 216. Processor 260 may be implemented by processor 110 in FIG. 1. Bias circuit 270 may be implemented with bias circuit 220 in FIG. 2, and current source 230 may be controllable by processor 260. Bias circuit 270 may also be implemented with a digital-to-analog converter (DAC) that can receive a digital value from processor 260 and generate a corresponding DC voltage.

Op-amp 252 senses/measures a voltage across inductor 214. An ideal inductor is purely reactive and has no voltage drop across the inductor. However, a practical inductor has some resistance, and a voltage is developed across this parasitic resistor and may be expressed as:

$$Vind = Rind \cdot Ibias, \qquad \text{Eq (2)}$$

where Rind is the resistance of inductor 214 and Vind is the voltage across inductor 214.

Op-amp 252 provides a measured Vind voltage to ADC 258, which quantizes the measured Vind voltage and provides a digitized Vind voltage to processor 260. Processor 260 computes the Ibias current through inductor 214 based on the digitized Vind voltage from ADC 258 and the known Rind resistance, or Ibias=Vind/Rind. Processor 260 compares the computed/measured Ibias current against the target Ibias current and controls bias circuit 270 to generate the Vbias voltage such that the measured Ibias current matches the target Ibias current. For example, if the measured Ibias current is less than the target Ibias current, then processor 260 may control bias circuit 270 to increase the Vbias voltage, which may then cause the Ibias current to increase. The converse would be true if the measured Ibias current is greater than the target Ibias current.

As shown in equation (2), the Ibias current may be determined based on the measured Vind voltage and the known Rind resistance. The Rind resistance may be determined in various manners. In one exemplary design, the Rind resistance may be determined by calibration, e.g., during manufacturing or in the field when power amplifier 210 is not operational. For calibration, a known Ibias current may be applied through inductor 214, and the Vind voltage across inductor 214 may be measured. The Rind resistance may then be determined based on the known Ibias current and the measured Vind voltage, or Rind=Vind/Ibias.

In another exemplary design, the Rind resistance on a given IC chip may be determined based on IC process conditions observed by the IC chip. For example, the Rind resistance may be characterized for many IC chips and over different IC process conditions via computer simulation, empirical measurements, etc. A look-up table of Rind versus IC process conditions may be obtained from the characterization. Each IC chip may include an IC process monitor that may determine the IC process conditions observed by that IC chip. The IC process conditions observed by the IC chip may be provided to the look-up table, which may provide the Rind resistance corresponding to the observed IC process conditions.

The resistance of inductor 212 may also be determined in other manners. The resistance may be determined once and stored for use later to calculate the Ibias current.

FIG. 3 shows use of inductor 214 to measure the bias current of power amplifier 210. FIG. 3 exploits the inherent resistance of inductor 214 to measure the voltage across the inductor. No external resistor is added in series between the drain of NMOS transistor 212 and Vdd. This is desirable since the external resistor would dissipate power and may have other deleterious effects.

Figure 4:
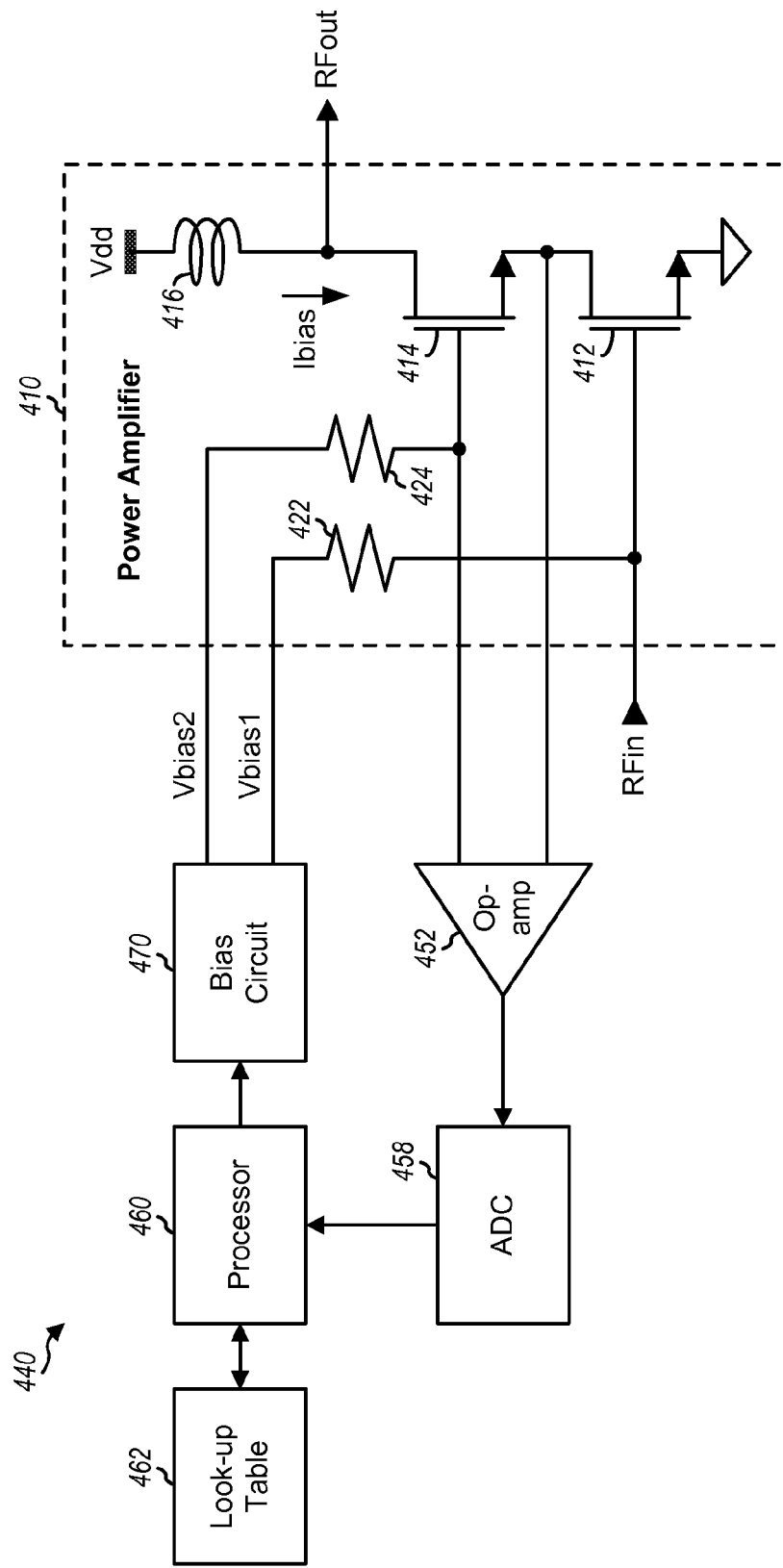
FIG. 4 shows an exemplary design of bias adjustment based on a gate-to-source voltage of a transistor in a power amplifier.

FIG. 4 shows a schematic diagram of an exemplary design of bias adjustment by measuring a gate-to-source voltage, Vgs, of an NMOS transistor within a power amplifier 410. In the exemplary design shown in FIG. 4, power amplifier 410 is implemented with two NMOS transistors 412 and 414 stacked together and coupled to an inductor 416. NMOS transistor 412 has its gate receiving an RFin signal and its source coupled to circuit ground. NMOS transistor 414 has its source coupled to the drain of NMOS transistor 412 and its drain providing an RFout signal. Inductor 416 has one end coupled to Vdd and the other end coupled to the drain of NMOS transistor 414. NMOS transistor 412 provides signal amplification for power amplifier 410. NMOS transistor 414 provides buffering for power amplifier 410. The voltage swing of the RFout signal may be large and may be split between NMOS transistors 412 and 414. Each NMOS transistor would then observe a smaller voltage swing (e.g., half the voltage swing), which may then improve the reliability of the NMOS transistors. Inductor 416 may act as a passive load and an RF choke and may also be part of an output matching circuit for power amplifier 410.

A resistor 422 has one end coupled to the gate of NMOS transistor 412 and the other end receiving a first bias voltage, Vbias1, from a bias circuit 470. A resistor 424 has one end coupled to the gate of NMOS transistor 414 and the other end receiving a second bias voltage, Vbias2, from bias circuit 470.

In the exemplary design shown in FIG. 4, a bias adjustment circuit 440 includes an op-amp 452, an ADC 458, a processor 460, a look-up table 462, and bias circuit 470. Processor 460 may be implemented by processor 110 in FIG. 1. Bias circuit 470 may be implemented with bias circuit 220 in FIG. 2, and current source 230 may be controllable by processor 460. Op-amp 452 has one input coupled to the source of NMOS transistor 414 and the other input coupled to the gate of NMOS transistor 414. Op-amp 452 senses/measures the Vgs voltage of NMOS transistor 414 and provides a measured Vgs voltage to ADC 458. ADC 458 quantizes the measured Vgs voltage and provides a digitized Vgs voltage to processor 460. Processor 460 estimates the Ibias current through NMOS transistor 414 based on the digitized Vgs voltage from ADC 458. Processor 460 compares the estimated/measured Ibias current against the target Ibias current and controls bias circuit 470 to generate the Vbias1 and/or Vbias2 voltage such that the measured Ibias current matches the target Ibias current. For example, if the measured Ibias current is less than the target Ibias current, then processor 460 may control bias circuit 470 to increase the Vbias1 and/or Vbias2 voltage, which may then cause the Ibias current to increase. The converse would be true if the measured Ibias current is greater than the target Ibias current.

Figure 9:
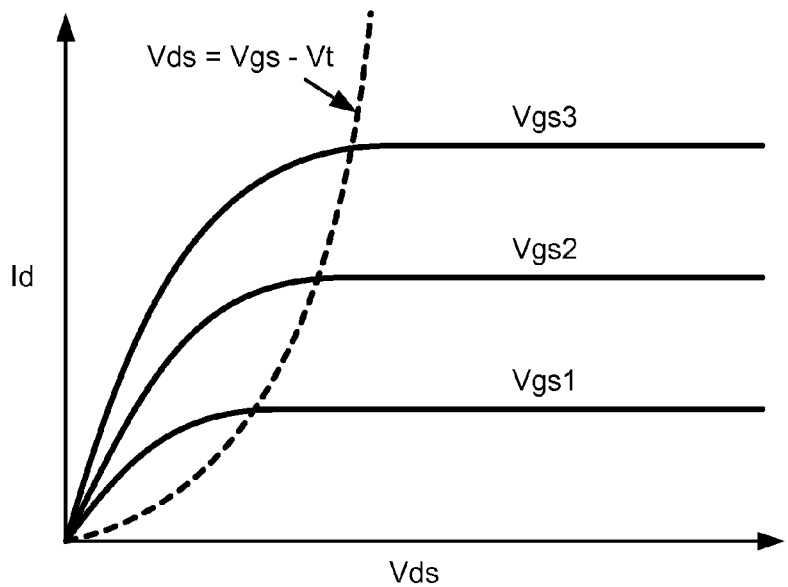
FIG. 9 shows a family of curves for drain current versus drain-to-source voltage.

FIG. 9 shows a family of curves for drain current, Id, versus drain-to-source voltage, Vds, of an NMOS transistor. A curve of Id versus Vds may be drawn for a given Vgs voltage. This curve would show the Id current increasing with the Vds voltage until a knee in the curve is reached. After the knee, the Id current flattens to a final value (ideally) and does not increase as the Vds voltage is increased. FIG. 9 shows three curves for three different Vgs voltages, Vgs1, Vgs2 and Vgs3. As shown in FIG. 9, the curves for progressively higher Vgs voltages have progressively larger final values of the Id current.

Referring back to FIG. 4, NMOS transistor 414 in power amplifier 410 may be operated in a saturation region above the knee. Hence, the Vgs voltage of NMOS transistor 414 may be mapped to a corresponding Id current. Look-up table 462 may store Id versus Vgs for NMOS transistor 414, which may be determined based on characterization of the NMOS transistor via measurements, computer simulation, etc. The Vgs voltage of NMOS transistor 414 may be measured. The measured Vgs voltage may be provided to look-up table 462, which may provide the corresponding Id current. Processor 460 may receive the Id current for the measured Vgs voltage and may direct bias circuit 470 to adjust the Vbias1 and/or Vbias2 voltage to obtain the target Id current.

FIG. 4 shows an exemplary design in which two NMOS transistors 412 and 414 are stacked together. In general, any number of NMOS transistors may be stacked together. The number of NMOS transistors to stack may be dependent on the maximum voltage swing of the RFout signal, the breakdown voltage of each NMOS transistor, etc. The Vgs voltage of one or more NMOS transistors in the stack may be measured and used to adjust one or more bias voltages to obtain the target Ibias current for the power amplifier.

Figure 5:
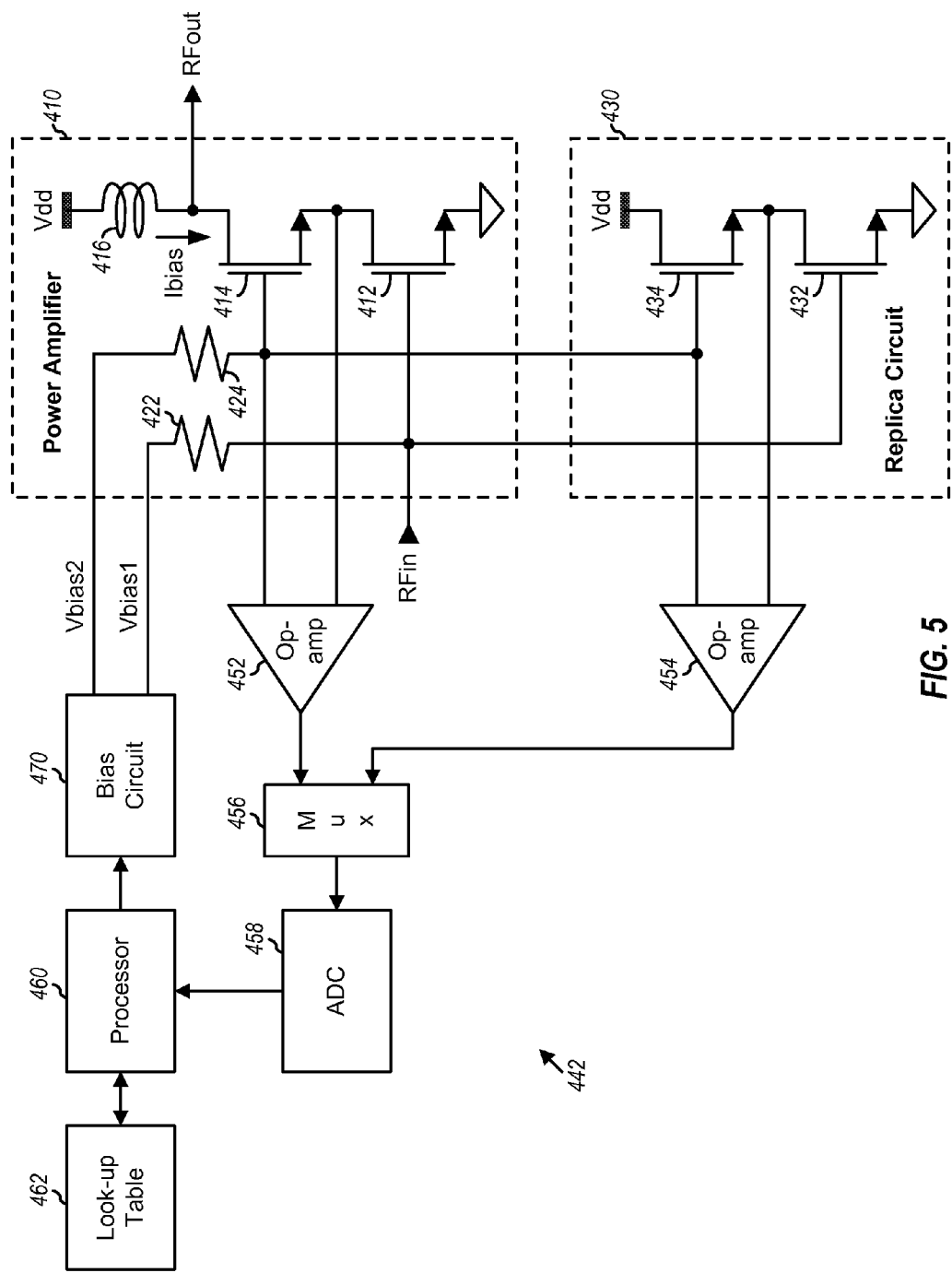
FIG. 5 shows an exemplary design of bias adjustment based on gate-to-source voltages of transistors in a power amplifier and a replica circuit.

FIG. 5 shows a schematic diagram of an exemplary design of bias adjustment by measuring the Vgs voltages of NMOS transistors within power amplifier 410 and a replica circuit 430. Replica circuit 430 includes two NMOS transistors 432 and 434 coupled in a stacked configuration. NMOS transistor 432 has its gate coupled to the gate of NMOS transistor 412 and its source coupled to circuit ground. NMOS transistor 434 has its source coupled to the drain of NMOS transistor 432, its gate coupled to the gate of NMOS transistor 414, and its drain coupled to Vdd.

In the exemplary design shown in FIG. 5, a bias adjustment circuit 442 includes op-amps 452 and 454, a multiplexer (Mux) 456, ADC 458, processor 460, look-up table 462, and bias circuit 470. Op-amp 452 has one input coupled to the source of NMOS transistor 414 and the other input coupled to the gate of NMOS transistor 414. Op-amp 452 senses/measures the Vgs voltage of NMOS transistor 414 and provides this measured Vgs voltage to a first input of multiplexer 456. Similarly, op-amp 454 has one input coupled to the source of NMOS transistor 434 and the other input coupled to the gate of NMOS transistor 434. Op-amp 454 senses/measures the Vgs voltage of NMOS transistor 434 and provides this measured Vgs voltage to a second input of multiplexer 456. Multiplexer 456 provides the measured Vgs voltage from op-amp 452 or the measured Vgs voltage from op-amp 454 to ADC 458. ADC 458 quantizes the measured Vgs voltage from multiplexer 456 and provides a digitized Vgs voltage to processor 460. Processor 460 receives the digitized Vgs voltages for NMOS transistors 414 and 434 and controls bias circuit 470 to generate the Vbias1 and/or Vbias2 voltage such that the target Ibias current is obtained for power amplifier 410, as described below.

Replica circuit 430 is a replica of NMOS transistors 412 and 414 in power amplifier 410. However, NMOS transistors 432 and 434 in replica circuit 430 may have smaller sizes than NMOS transistors 412 and 414 in power amplifier 410 in order to reduce power consumption. Furthermore, NMOS transistors 432 and 434 in replica circuit 430 are not exposed to large voltage swing and high bias current observed by NMOS transistors 412 and 414 in power amplifier 410. Hence, NMOS transistors 432 and 434 experience less aging than NMOS transistors 412 and 414. This distinction may be used to set the target Ibias current for power amplifier 410.

The target Ibias current for power amplifier 410 may be obtained as follows. Initially, the Vgs voltage of NMOS transistor 434 in replica circuit 430 may be measured with nominal Vbias1 and Vbias2 voltages applied at the gates of NMOS transistors 432 and 434, respectively. The nominal Vbias1 and Vbias2 voltages should provide the target Id current through NMOS transistors 432 and 434 and may be determined by prior characterization of replica circuit 430. The Vgs voltage of NMOS transistor 414 in power amplifier 410 may then be measured with the nominal Vbias1 and Vbias2 voltages applied at the gates of NMOS transistors 412 and 414, respectively. The measured Vgs voltage of NMOS transistor 414 may be compared against the Vgs voltage of NMOS transistor 434. The Vbias1 and/or Vbias2 voltage may then be adjusted so that the measured Vgs voltage of NMOS transistor 414 matches the measured Vgs voltage of NMOS transistor 434. By matching the Vgs voltage of NMOS transistor 414 to the Vgs voltage of NMOS transistor 434, the target Id current through NMOS transistor 414 (and hence the target Ibias current for power amplifier 410) may be obtained.

Although not shown in FIG. 5, the Id current through NMOS transistor 434 may be measured, and the Vbias1 and/or Vbias2 voltage may be varied such that the target Id current is obtained. The Vbias1 and Vbias2 voltages that can provide the target Id current through NMOS transistors 434 may be saved as the nominal Vbias1 and Vbias2 voltages.

Figure 6:
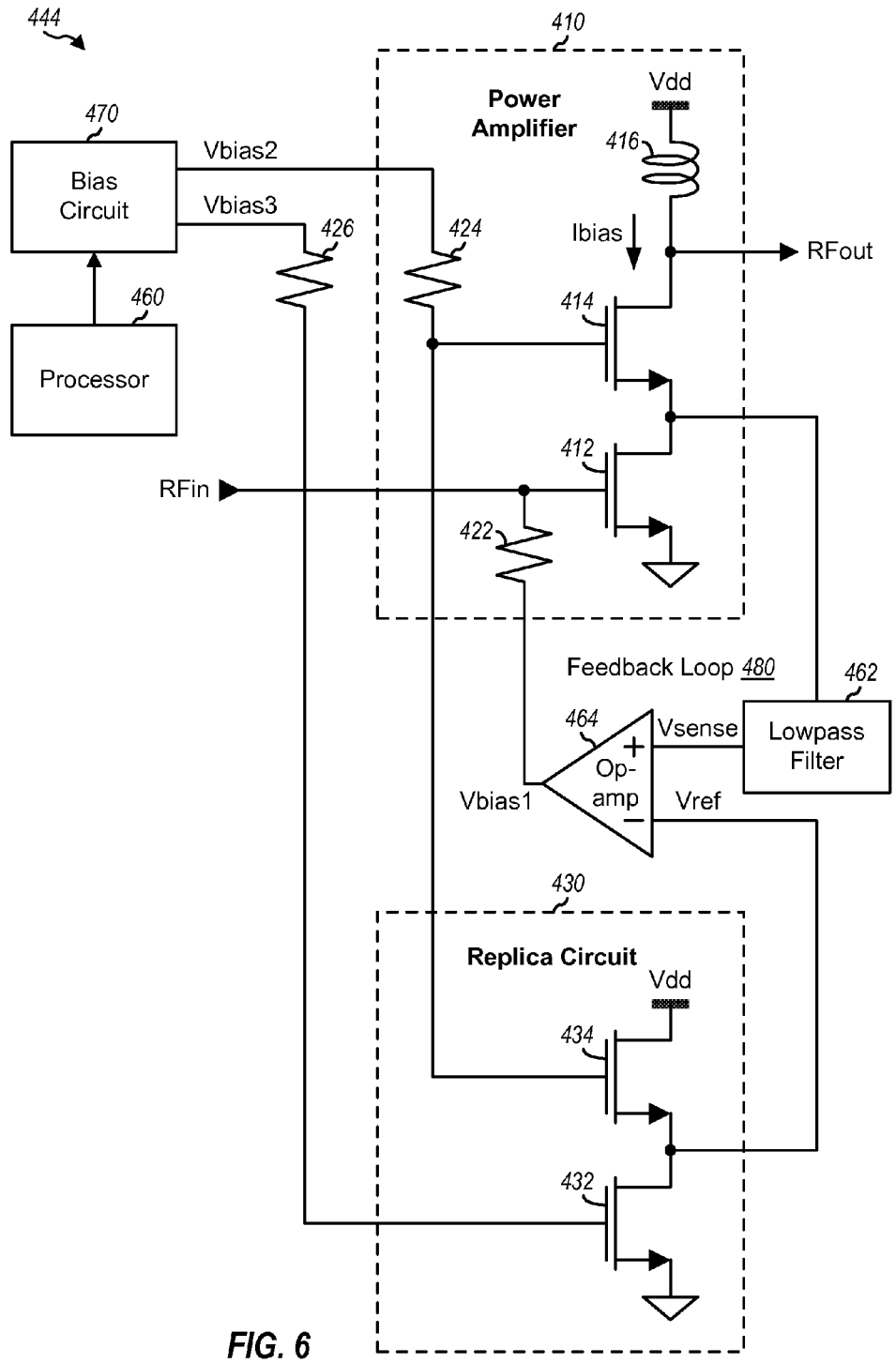
FIG. 6 shows an exemplary design of bias adjustment with a feedback loop.

FIG. 6 shows a schematic diagram of an exemplary design of bias adjustment using a feedback loop. Power amplifier 410 and replica circuit 430 are coupled as described above for FIGS. 4 and 5, respectively. In the exemplary design shown in FIG. 6, a bias adjustment circuit 444 includes a lowpass filter 462, an op-amp 464, processor 460, and bias circuit 470. Lowpass filter 462 and op-amp 464 form a feedback circuit. Lowpass filter 462 has its input coupled to the drain of NMOS transistor 412 in power amplifier 410, performs filtering to remove RF components in its input signal, and provides a sensed voltage, Vsense. The Vsense voltage is indicative of the direct current (DC) voltage at the drain of NMOS transistor 412. Op-amp 464 has its non-inverting input coupled to the output of lowpass filter 464 and its inverting input coupled to the drain of NMOS transistor 432. The output of op-amp 464 is coupled to one end of resistor 422, and the other end of resistor 422 is coupled to the gate of NMOS transistor 412. Op-amp 464 provides a Vbias1 voltage for the gate of NMOS transistor 412. Bias circuit 470 provides a Vbias2 voltage to one end of resistor 424, and the other end of resistor 424 is coupled to the gates of both NMOS transistors 414 and 434. Bias circuit 470 also provides a Vbias3 voltage to one end of a resistor 426, and the other end of resistor 426 is coupled to the gate of NMOS transistor 432 in replica circuit 430.

A feedback loop 480 is formed by lowpass filter 462, op-amp 464, resistor 422, and NMOS transistor 412. Replica 430 generates a reference voltage, Vref, for the feedback loop. Bias circuit 470 generates nominal Vbias2 and Vbias3 voltages for NMOS transistors 434 and 432, respectively, such that the target Id current flows through these NMOS transistors. The voltage at the drain of NMOS transistor 432 is used as the Vref voltage for the feedback loop. Op-amp 464 compares the Vsense voltage against the Vref voltage and generates the Vbias1 voltage such that the Vsense voltage matches the Vref voltage. For example, if the Vsense voltage is higher than the Vref voltage, then op-amp 464 provides a higher Vbias1 voltage, which then turns on NMOS transistor 412 harder and reduces the voltage at the drain of NMOS transistor 412. The converse is true if the Vsense voltage is lower than the Vref voltage.

In the exemplary design shown in FIG. 6, the feedback loop adjusts the Vbias1 voltage for NMOS transistor 412 such that the DC voltage at the drain of NMOS transistor 412 matches the DC voltage at the drain of NMOS transistor 432. Since the same Vbias2 voltage is applied to the gates of NMOS transistors 414 and 434, the feedback loop essentially matches the Vgs voltage of NMOS transistor 414 to the Vgs voltage of NMOS transistor 434. This would then result in a target Id current being obtained for NMOS transistor 414, and hence the target Ibias current being obtained for power amplifier 410.

The nominal Vbias1 and/or Vbias2 voltage that can provide the target Id current may be determined by prior characterization of replica circuit 430. Alternatively, the Id current through NMOS transistor 434 may be measured, and the Vbias1 and/or Vbias2 voltage may be varied such that the target Id current is obtained.

The feedback loop in FIG. 6 can operate continuously, even when power amplifier 410 is operational. Alternatively, the feedback loop may be operated to set the Vbias1 voltage, which may be measured with an ADC. The feedback loop may then be disconnected, and the measured Vbias1 voltage may be generated (e.g., by bias circuit 470) and applied to resistor 422.

Figure 7:
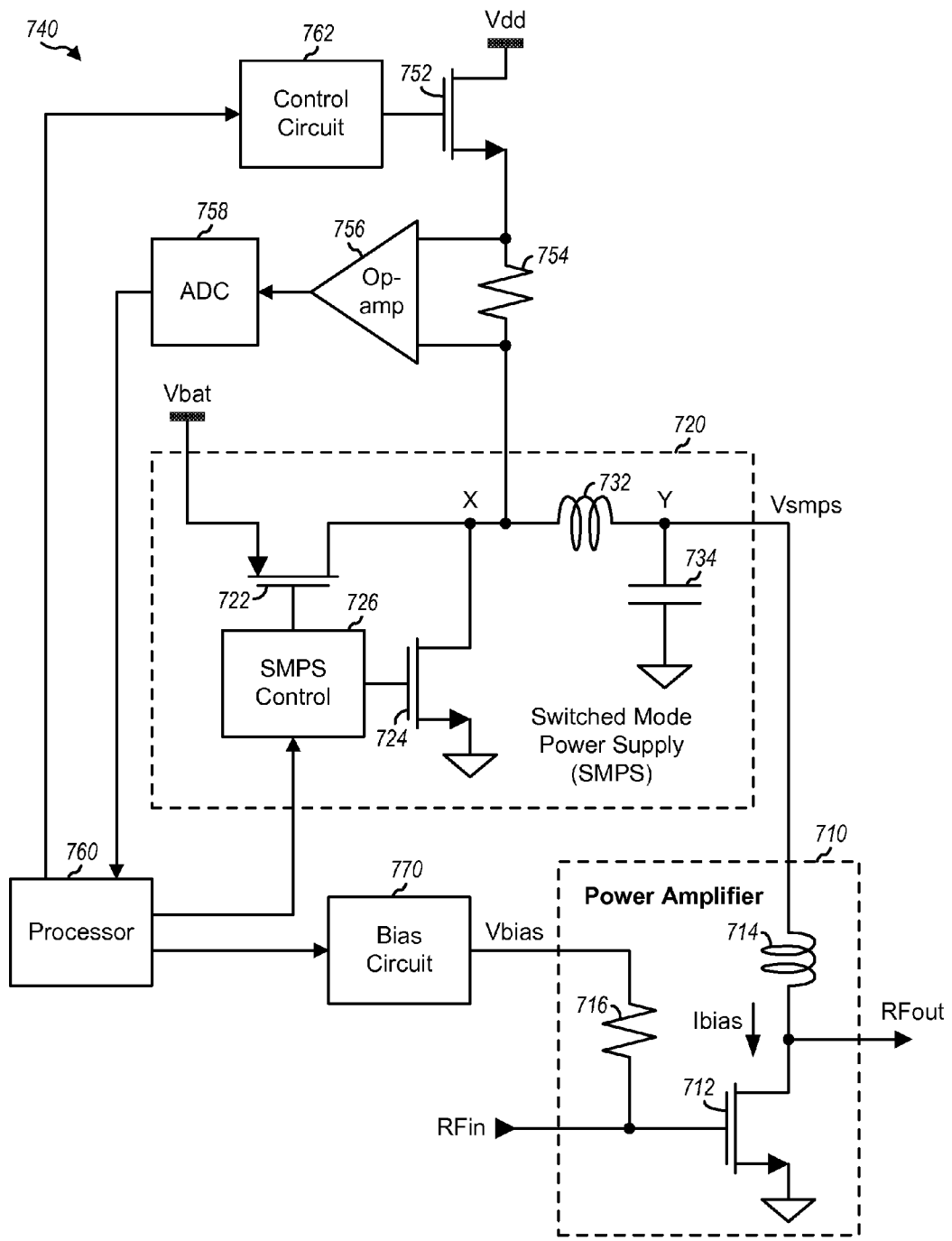
FIGS. 7 and 8 show two exemplary designs of bias adjustment using a switched mode power supply to isolate a supply voltage.

FIG. 7 shows a schematic diagram of an exemplary design of bias adjustment using a switched mode power supply (SMPS) 720 to isolate a supply voltage from a power amplifier 710. Power amplifier 710 includes an NMOS transistor 712, an inductor 714, and a resistor 716, which are coupled in similar manner as NMOS transistor 212, inductor 214, and resistor 216 in power amplifier 210 in FIG. 2, with one exception. Inductor 714 is coupled to a Vsmps supply voltage provided by SMPS 720, instead of Vdd.

Within SMPS 720, a P-channel metal oxide semiconductor (PMOS) transistor 722 has its source coupled to a battery supply, Vbat, its drain coupled to node X, and its gate coupled to an SMPS control unit 726. An NMOS transistor 724 has its source coupled to circuit ground, its drain coupled to node X, and its gate coupled to SMPS control unit 726. SMPS control unit 726 receives an output from a processor 760 as well as the voltage at node Y (not shown in FIG. 7 for simplicity) and generates a first control voltage for PMOS transistor 722 and a second control voltage for NMOS transistor 724. An inductor 732 is coupled between node X and node Y. A capacitor 734 is coupled between node Y and circuit ground. Inductor 714 in power amplifier 710 is coupled to node Y, which provides the Vsmps voltage.

A bias adjustment circuit 740 generates a Vbias voltage for NMOS transistor 712 in power amplifier 710 such that the target Ibias current is provided to power amplifier 710. Within circuit 740, an NMOS transistor 752 has its drain coupled to Vdd, its gate coupled to a control circuit 762, and its source coupled to one end of a resistor 754. The other end of resistor 754 is coupled to node X. An op-amp 756 has its two inputs coupled to the two ends of resistor 754 and its output coupled to an ADC 758. Processor 760 receives the digital output from ADC 758, directs control circuit 762 to generate the desired Ibias current, and controls a bias circuit 770 to generate the desired Vbias voltage for NMOS transistor 712. Processor 760 may be implemented by processor 110 in FIG. 1. Bias circuit 770 may be implemented with bias circuit 220 in FIG. 2.

In a normal operational mode, NMOS transistor 752 is turned off, and SMPS 720 is turned on and generates the Vsmps voltage for power amplifier 710 based on the Vbat voltage. SMPS control unit 726 may operate as a pulse width modulator (PWM) generator and may alternately turn on and off PMOS transistor 722. During an on state, PMOS transistor 722 is turned on, and NMOS transistor 724 is turned off. The Vbat voltage is coupled via PMOS transistor 722 to inductor 732, which stores energy from the Vbat voltage. The Vbat voltage provides current to capacitor 734 and power amplifier 710 during the on state. During an off state, PMOS transistor 722 is turned off, and NMOS transistor 724 is turned on. The Vbat voltage is disconnected from inductor 732 by PMOS transistor 722. Inductor 732 is coupled to circuit ground by NMOS transistor 724 and provides its stored energy to capacitor 734 and power amplifier 710. Capacitor 734 maintains the Vsmps voltage approximately constant and also provides its charge to power amplifier 710 during the off state. Inductor 732 and capacitor 734 also form a lowpass filter that suppresses ripples in the Vsmps voltage due to switching of MOS transistors 722 and 724.

In a bias adjustment mode, SMPS 720 is turned off by turning off both MOS transistors 722 and 724. NMOS transistor 752 is turned on and passes an Ibias current through resistor 754 to power amplifier 710. Op-amp 756 senses/measures the voltage, Vres, across resistor 754. ADC 758 quantizes the measured Vres voltage and provides a digitized Vres voltage to processor 760. Processor 760 computes the Ibias current through resistor 754 based on the digitized Vres voltage from ADC 758 and the known resistance, Rres, of resistor 754, or Ibias=Vres/Rres. Processor 760 compares the computed/measured Ibias current against the target Ibias current and controls bias circuit 770 to generate the Vbias voltage such that the measured Ibias current matches the target Ibias current. For example, if the measured Ibias current is less than the target Ibias current, then processor 760 may control bias circuit 770 to increase the Vbias voltage, which would then cause the Ibias current to increase. The converse would be true if the measured Ibias current is greater than the target Ibias current. Processor 760 may direct control circuit 762 to turn off NMOS transistor 752 in the normal operational mode or to turn on NMOS transistor 752 in the bias adjustment mode. Processor 760 may also direct control circuit 762 to generate a control voltage for NMOS transistor 752 such that the Vsmps voltage in the bias adjustment mode is similar to the Vsmps voltage in the normal operational mode.

SMPS 720 is normally used to regulate a battery voltage or an external voltage to a lower supply voltage for power amplifier 710, which may then reduce power consumption and improve power-added efficiency (PAE). The exemplary design shown in FIG. 7 exploits SMPS 720 to isolate the Vbat voltage from node X, which is achieved by turning off both MOS transistor 722 and 724. With node X isolated from the Vbat voltage, an external current may be applied to power amplifier 710 via NMOS transistor 752 and resistor 754. This external current may be measured and used to generate the proper Vbias voltage for NMOS transistor 712 to obtain the target Ibias current for power amplifier 710. During the normal operational mode, NMOS transistor 752 is turned off and does not affect the operation of power amplifier 710.

Figure 8:
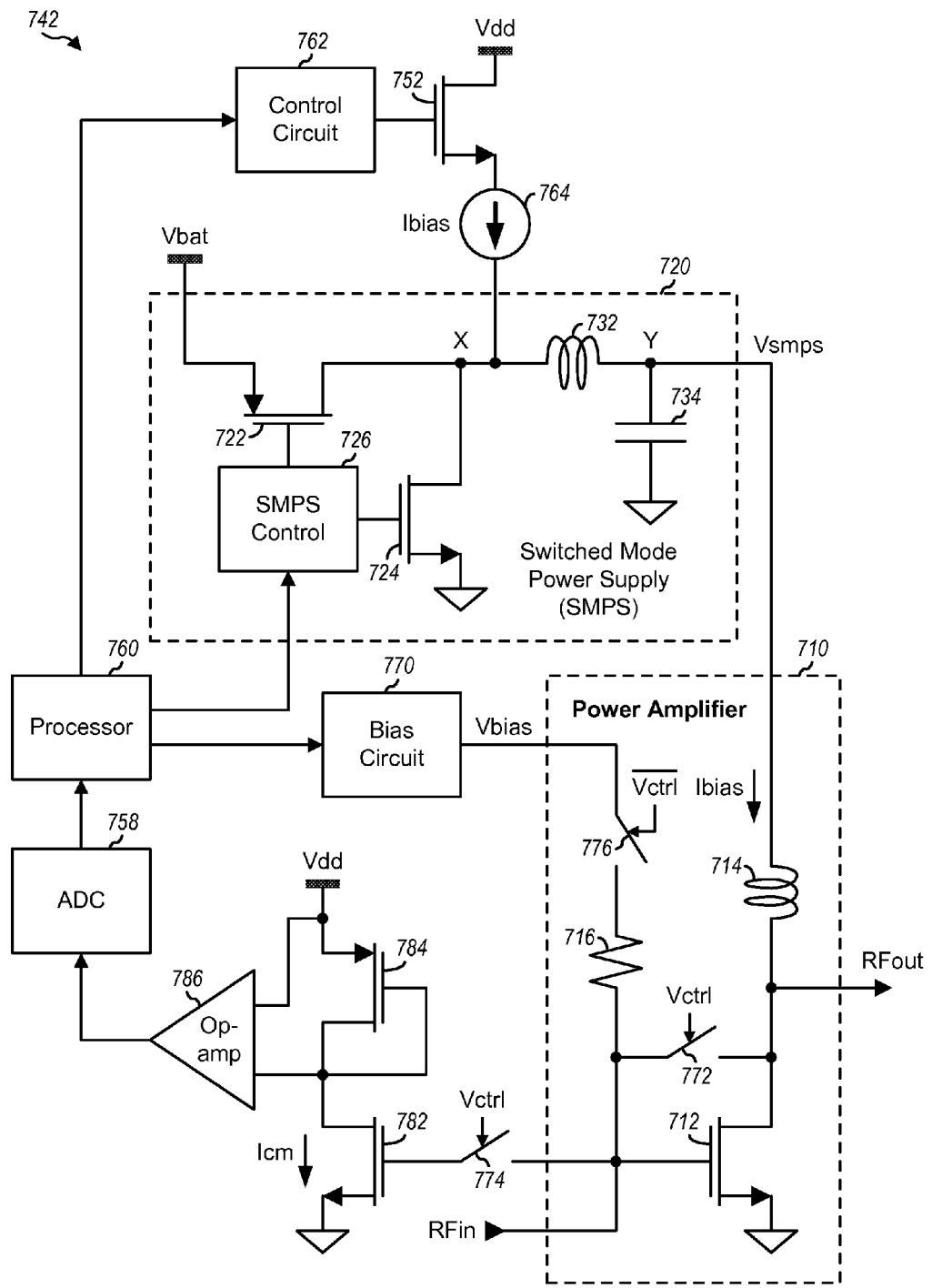

FIG. 8 shows a schematic diagram of another exemplary design of bias adjustment using SMPS 720. Power amplifier 710 and SMPS 720 are coupled as described above for FIG. 7. A bias adjustment circuit 742 generates a Vbias voltage for NMOS transistor 712 in power amplifier 710 such that the target Ibias current is provided to the power amplifier. Within circuit 742, NMOS transistor 752, control circuit 762, and processor 760 are coupled as described above for FIG. 7. Resistor 754 in FIG. 7 is replaced with a current source 764 that can provide a known current of Ibias to power amplifier 710. NMOS transistor 752 and current source 764 may also be replaced with a PMOS current source transistor (or an ideal adjustable current source) controlled by control circuit 762. A switch 772 has one terminal coupled to the gate of NMOS transistor 712 and the other terminal coupled to the drain of NMOS transistor 712. A switch 774 has one terminal coupled to the gate of NMOS transistor 712 and the other terminal coupled to the gate of an NMOS transistor 782. Switches 772 and 774 receive a Vctrl control signal. A switch 776 is coupled between the output of bias circuit 770 and resistor 716 and receives a Vctrl control signal. NMOS transistor 782 has its source coupled to circuit ground and its drain coupled to one input of an op-amp 786. A PMOS transistor 784 has its drain and gate coupled to the drain of NMOS transistor 782 and its source coupled to Vdd. PMOS transistor 784 may also be replaced with a resistor having a known value. Op-amp 786 has its other input coupled to Vdd and its output coupled to ADC 758. Processor 760 receives the digital output from ADC 758, directs control circuit 762 to provide the desired Ibias current, and controls bias circuit 770 to generate the desired Vbias voltage for NMOS transistor 712.

In the normal operational mode, NMOS transistors 752 is turned off, switches 772 and 774 are opened, switch 776 is closed, and SMPS 720 is turned on to generate the Vsmps voltage for power amplifier 710. In the bias adjustment mode, SMPS 720 is turned off by turning off both MOS transistors 722 and 724. NMOS transistor 752 is turned on and passes the known current of Ibias to power amplifier 710. Switches 772 and 774 are closed, and NMOS transistors 712 and 782 operate as a current mirror. Since the same DC voltage is applied to the gates of NMOS transistors 712 and 782, the Icm current through NMOS transistor 782 is related to the Ibias current through NMOS transistor 712, or Icm=Ibias/K, where K is the ratio of the size of NMOS transistor 712 to the size of NMOS transistor 782. The target Ibias current may be converted to a corresponding target Icm current.

Op-amp 786 senses/measures the Vgs voltage of PMOS transistor 784 with switches 772 and 774 being closed, switch 776 being opened, and the Vbias voltage being disconnected. ADC 758 quantizes the measured Vgs voltage and provides a digitized Vgs voltage to processor 760. Processor 760 computes the Icm current through NMOS transistor 782 based on the digitized Vgs voltage from ADC 758 and the known drain-to-source resistance, Rds, of PMOS transistor 784, or Icm=Vgs/Rds. Rds may be determined by characterizing PMOS transistor 784. Processor 760 compares the computed/measured Icm current against the target Icm current and determines the Vbias voltage such that the measured Icm current matches the target Icm current. For example, if the measured Icm current is less than the target Icm current, then processor 760 may increase the Vbias voltage, which would then cause both the Ibias current and the Icm current to increase. The converse would be true if the measured Icm current is greater than the target Icm current. Bias circuit 770 generates the Vbias voltage as indicated by processor 760 and applies the Vbias voltage via switch 776, with switch 772 and 774 being opened. Measurement of the Icm current and application of the Vbias voltage may be performed sequentially or iteratively. For example, the Icm current may be measured with the Vbias voltage being disconnected by opening switch 776, then the Vbias voltage may be applied with switches 772 and 774 being closed. Switch 776 disconnects bias circuit 770 when switches 772 and 774 are closed and the Icm current is being measured. Switches 772 and 774 are opened while the Vbias voltage is connected.

FIGS. 2 through 8 show various exemplary designs of bias adjustment circuits that can directly or indirectly measure a bias current through a power amplifier and set a bias voltage to obtain a target bias current. Other designs of the bias adjustment circuits may be implemented based on the description herein. The bias adjustment circuits may be used for power amplifiers (as described above) as well as for other types of amplifiers.

The techniques described herein enable measurement and adjustment of the bias current of an amplifier. By dynamically adjusting the bias current through feedback from the amplifier, the effects of aging may be compensated for. This may provide various advantages such as more consistent amplifier performance, improved production yield, mitigation of reliability issues, etc. In addition, bias shifts due to other effects such as IC process, temperature, power supply voltage, etc., may also be compensated for. The techniques may enable use of lower cost IC process technologies (e.g., silicon-on-insulator (SOI) or bulk silicon (Si)) that may have aging related reliability problems.

In general, the bias current of an amplifier may be adjusted one or more times, when appropriate. In an exemplary design, the bias current may be adjusted at the start of a call, e.g., before RF transmission has begun. For example, the bias voltage may be adjusted to restore the bias current of a power amplifier to a target value, which may be selected to obtain the desired performance. The techniques described herein may be used to compensate for bias shifts due to various factors such as aging, IC process variation, power supply voltage, temperature, etc.

In an exemplary design, an apparatus (e.g., an integrated circuit, a wireless device, etc.) may comprise an amplifier and a bias circuit, e.g., as shown in FIG. 2. The amplifier may comprise a first transistor (e.g., NMOS transistor 212). The bias circuit may comprise a second transistor (e.g., NMOS transistor 222) coupled to the first transistor in the amplifier. The first and second transistors may form a current mirror. The bias circuit may generate a bias voltage for the first and second transistors to obtain a target bias current for the first transistor. The bias circuit may further comprise a current source (e.g., current source 230) coupled to the second transistor. The bias circuit may generate the bias voltage to obtain a target current from the current source, which may be determined based on the target bias current for the first transistor. The amplifier may be a power amplifier or some other type of amplifier.

In another exemplary design, an apparatus may comprise an amplifier, a sensing circuit, and a bias circuit, e.g., as shown in FIG. 3. The amplifier may comprise a transistor (e.g., NMOS transistor 212) coupled to an inductor (e.g., inductor 214). The sensing circuit (e.g., op-amp 252) may be coupled to the inductor and may measure a voltage across the inductor. The bias circuit may be coupled to the transistor and may generate a bias voltage for the transistor based on the measured voltage across the inductor to obtain a target bias current for the transistor.

The apparatus may further comprise an ADC and a processor. The ADC may digitize the measured voltage and provide a digitized voltage. The processor may generate a control for the bias circuit based on the digitized voltage. The processor may determine a measured bias current for the transistor based on the digitized voltage and a known resistor value for the inductor. The processor may generate the control for the bias circuit based on the measured bias current and the target bias current. The resistor value for the inductor may be determined by applying a known current through the inductor and measuring the voltage across the inductor, e.g., during calibration in the factory or in the field prior to a call. The resistor value for the inductor may also be determined based on IC conditions observed by the amplifier, which may be determined with an IC process monitor.

In yet another exemplary design, an apparatus may comprise an amplifier, a sensing circuit, and a bias circuit, e.g., as shown in FIG. 4 or 5. The amplifier may comprise first and second transistors coupled in a stack. The first transistor (e.g., NMOS transistor 412) may be a lower transistor in the stack and may be coupled to circuit ground. The second transistor (e.g., NMOS transistor 414) may be an upper transistor in the stack. The sensing circuit (e.g., op-amp 452) may be coupled to the second transistor and may measure a Vgs voltage of the second transistor. The bias circuit may be coupled to at least one transistor among the first and second transistors. The bias circuit may generate at least one bias voltage for the at least one transistor based on the measured Vgs voltage of the second transistor to obtain a target bias current for the first and second transistors.

The apparatus may further comprise an ADC and a processor, e.g., as shown in FIG. 4. The ADC may digitize the measured Vgs voltage and provide a digitized voltage. The processor may generate a control for the bias circuit based on the digitized voltage. In an exemplary design, the processor may determine a target Vgs voltage corresponding to the target bias current and may generate the control for the bias circuit based on the measured Vgs voltage and the target Vgs voltage. In another exemplary design, a look-up table may store bias current versus Vgs voltage for the second transistor. The processor may obtain a measured bias current for the measured Vgs voltage from the look-up table and may generate the control for the bias circuit based on the measured bias current and the target bias current.

The apparatus may further comprise a replica circuit and a second sensing circuit, e.g., as shown in FIG. 5. The replica circuit may comprise third and fourth transistors (e.g., NMOS transistors 432 and 434) coupled in a stack and replicating the first and second transistors in the amplifier. The first and third transistors may receive a first bias voltage (Vbias1), and the second and fourth transistors may receive a second bias voltage (Vbias2). The second sensing circuit (e.g., op-amp 454) may be coupled to the fourth transistor in the replica circuit and may measure a Vgs voltage of the fourth transistor. The bias circuit may generate the at least one bias voltage for the at least one transistor in the amplifier based on the measured Vgs voltages of the second and fourth transistors. The ADC may digitize the measured Vgs voltage of the second transistor and provide a first digitized voltage. The ADC may also digitize the measured Vgs voltage of the fourth transistor and provide a second digitized voltage. The processor may generate a control for the bias circuit based on the first and second digitized voltages. The processor may obtain the second digitized voltage for the measured Vgs voltage of the fourth transistor with the first and second bias voltages having nominal values. The processor may generate the control for the bias circuit to cause the measured Vgs voltage of the second transistor to match the measured Vgs voltage of the fourth transistor.

In yet another exemplary design, an apparatus may comprise an amplifier, a replica circuit, and a feedback circuit, e.g., as shown in FIG. 6. The amplifier may comprise at least one transistor. The replica circuit may comprise at least one transistor replicating the at least one transistor in the amplifier. The feedback circuit may be coupled to the amplifier and the replica circuit. The feedback circuit may sense a first voltage in the amplifier, sense a second voltage in the replica circuit, and generate a bias voltage for the amplifier based on the first and second voltages. The feedback circuit may comprise a filter and a sensing circuit, e.g., filter 462 and op-amp 464 in FIG. 6. The filter may receive and filter the first voltage and provide a third voltage. The sensing circuit may receive the second and third voltages and generate the bias voltage for the gate of the first transistor.

The amplifier may comprise first and second transistors coupled in a stack, and the replica circuit may comprise third and fourth transistors coupled in a stack, e.g., as shown in FIG. 6. The first voltage may be a drain voltage of the first transistor, the second voltage may be a drain voltage of the third transistor, and the bias voltage may be applied to the gate of the first transistor. The second and fourth transistors may receive a second bias voltage (Vbias2), and the third transistor may receive a third bias voltage (Vbias3). The second and third bias voltages may provide a target bias current for the third and fourth transistors in the replica circuit.

In yet another exemplary design, an apparatus may comprise an amplifier, an SMPS, and a bias circuit, e.g., as shown in FIG. 7 or 8. The amplifier may amplify an input signal and provide an output signal. The SMPS may be coupled to the amplifier and may receive a first supply voltage and provide a second supply voltage to the amplifier. The bias circuit may be coupled to the amplifier and may generate a bias voltage for the amplifier to obtain a target bias current for the amplifier. The bias circuit may receive a control determined based on a measured bias current for the amplifier, with the SMPS disabled, and may generate the bias voltage for the amplifier based on the control.

The apparatus may further comprise a resistor and a sensing circuit, e.g., as shown in FIG. 7. The resistor may be coupled to the amplifier (e.g., via the SMPS) and may provide a bias current for the amplifier when the SMPS is disabled. The sensing circuit (e.g., op-amp 756) may be coupled to the resistor and may measure a voltage across the resistor. The bias circuit may receive a control determined based on the measured voltage across the resistor and may generate the bias voltage for the amplifier based on the control. The apparatus may further comprise an ADC and a processor. The ADC may digitize the measured voltage across the resistor and provide a digitized voltage. The processor may generate the control for the bias circuit based on the digitized voltage. The processor may determine a measured bias current for the amplifier based on the digitized voltage and a known value of the resistor. The processor may then generate the control for the bias circuit based on the measured bias current and the target bias current.

The amplifier may comprise a first transistor (e.g., NMOS transistor 712 in FIG. 8). The apparatus may further comprise a second transistor and a sensing circuit. The second transistor (e.g., NMOS transistor 782) may be coupled to the first transistor in the amplifier via at least one switch. The first and second transistors may form a current mirror when the at least one switch is closed. The sensing circuit (e.g., PMOS transistor 784 and op-amp 786) may be coupled to the second transistor and may measure a current through the second transistor. The ADC may digitize a sensed voltage from the sensing circuit, which may be indicative of the measured current through the second transistor. The processor may generate a control for the bias circuit based on the digitized voltage. For example, the processor may determine the measured bias current for the amplifier based on the digitized voltage and may generate the control for the bias circuit based on the measured bias current and the target bias current.

Figure 10:
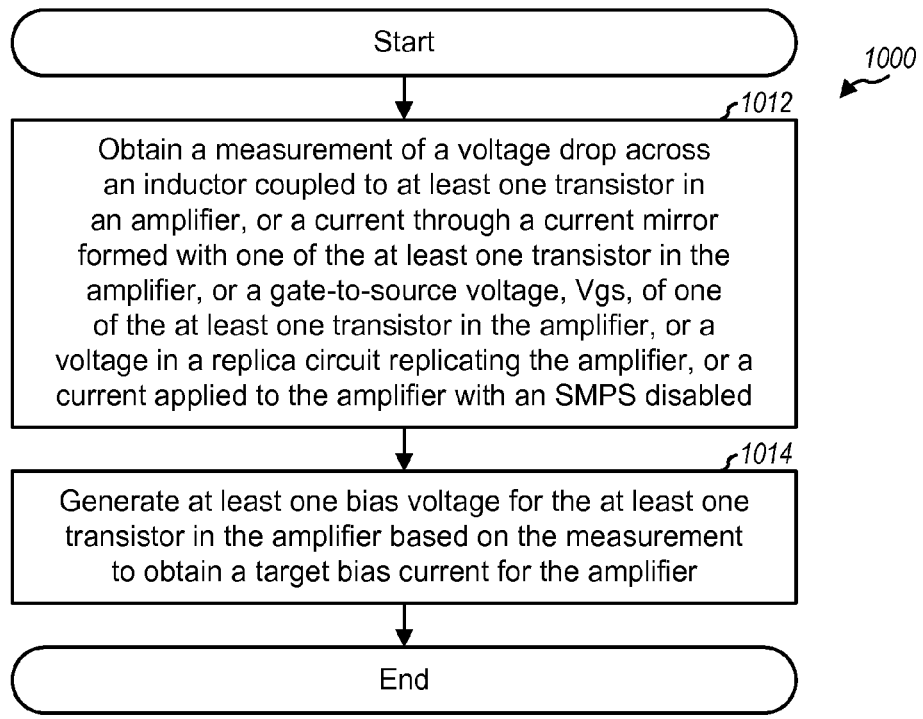
FIG. 10 shows an exemplary design of a process for adjusting bias current.

FIG. 10 shows an exemplary design of a process 1000 for adjusting bias current. A measurement of a voltage across an inductor coupled to at least one transistor in an amplifier (e.g., as shown in FIG. 3), or a current through a current mirror formed with one of the at least one transistor in the amplifier (e.g., as shown in FIG. 2), or a Vgs voltage of one of the at least one transistor in the amplifier (e.g., as shown in FIG. 4 or 5), or a voltage in a replica circuit replicating the amplifier (e.g., as shown in FIG. 6), or a current applied to the amplifier with an SMPS disabled (e.g., as shown in FIG. 7 or 8) may be obtained (block 1012). At least one bias voltage for the at least one transistor in the amplifier may be generated based on the measurement to obtain a target bias current for the amplifier (block 1014).

In an exemplary design of block 1014 shown in FIG. 2, a measured bias current for the amplifier may be determined based on the current through the current mirror formed with one of the at least one transistor in the amplifier. The at least one bias voltage may be generated based on the measured bias current and the target bias current for the amplifier.

In another exemplary design of block 1014 shown in FIG. 3, the voltage across the inductor may be digitized to obtain a digitized voltage. A measured bias current for the amplifier may be determined based on the digitized voltage and a resistor value for the inductor. The at least one bias voltage may be generated based on the measured bias current and the target bias current for the amplifier.

In yet another exemplary design of block 1014 shown in FIG. 4, a measured bias current for the amplifier may be determined based on the Vgs voltage of one of the at least one transistor in the amplifier. The at least one bias voltage may be generated based on the measured bias current and the target bias current for the amplifier. Alternatively, the at least one bias voltage may be generated based on the Vgs voltage of one of the at least one transistor in the amplifier and a target Vgs voltage.

In yet another exemplary design of block 1014 shown in FIG. 5, a second measurement of a Vgs voltage of one of at least one transistor in the replica circuit may be obtained. The at least one bias voltage for the at least one transistor in the amplifier may be generated based further on the second measurement to obtain the target bias current for the amplifier.

In yet another exemplary design of block 1014 shown in FIG. 6, a voltage in the amplifier may be sensed. A bias voltage for the amplifier may be generated based on the voltage in the replica circuit and the voltage in the amplifier using a feedback loop.

In an exemplary design of block 1012 shown in FIG. 7, a voltage across a resistor coupled to the amplifier may be measured with the SMPS disabled. The current applied to the amplifier may be determined based on the measured voltage.

In another exemplary design of block 1012 shown in FIG. 8, a current through a current mirror formed with one of the at least one transistor in the amplifier may be measured. The current applied to the amplifier may be determined based on the measured current through the current mirror.

The amplifiers and circuits described herein may be implemented on an IC, an analog IC, an RFIC, a mixed-signal IC, an ASIC, a printed circuit board (PCB), an electronic device, etc. The amplifiers and circuits may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the amplifiers and circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier comprising first and second transistors coupled in a stack;
   a sensing circuit coupled to the second transistor in the amplifier and to measure a gate-to-source voltage, Vgs, of the second transistor; and
   a bias circuit coupled to at least one transistor among the first and second transistors and to generate at least one bias voltage for the at least one transistor based on the measured Vgs voltage of the second transistor to obtain a target bias current for the first and second transistors.

2. The apparatus of claim 1, the first transistor is a lower transistor in the stack and is coupled to circuit ground, and the second transistor is an upper transistor in the stack.

3. The apparatus of claim 1, further comprising:
   an analog-to-digital converter (ADC) to digitize the measured Vgs voltage and provide a digitized voltage; and
   a processor to receive the digitized voltage and generate a control for the bias circuit based on the digitized voltage.

4. The apparatus of claim 3, the processor determines a target Vgs voltage corresponding to the target bias current and generates the control for the bias circuit based on the measured Vgs voltage and the target Vgs voltage.

5. The apparatus of claim 3, further comprising:
   a look-up table to store bias current versus Vgs voltage for the second transistor, the processor obtains a measured bias current for the measured Vgs voltage from the look-up table and generates the control for the bias circuit based on the measured bias current and the target bias current.

6. The apparatus of claim 1, further comprising:
   a replica circuit comprising third and fourth transistors coupled in a stack and replicating the first and second transistors in the amplifier; and
   a second sensing circuit coupled to the fourth transistor in the replica circuit and to measure a Vgs voltage of the fourth transistor, and
   the bias circuit generates the at least one bias voltage for the at least one transistor in the amplifier based on the measured Vgs voltage of the second transistor and the measured Vgs voltage of the fourth transistor.

7. The apparatus of claim 6, the first and third transistors receive a first bias voltage, and the second and fourth transistors receive a second bias voltage.

8. The apparatus of claim 7, further comprising:
   an analog-to-digital converter (ADC) to digitize the measured Vgs voltage of the second transistor and provide a first digitized voltage and to digitize the measured Vgs voltage of the fourth transistor and provide a second digitized voltage; and a processor to receive the first and second digitized voltages and generate a control for the bias circuit based on the first and second digitized voltages.

9. The apparatus of claim 8, the processor obtains the second digitized voltage for the measured Vgs voltage of the fourth transistor with the first and second bias voltages having nominal values and generates the control for the bias circuit to cause the measured Vgs voltage of the second transistor to match the measured Vgs voltage of the fourth transistor.

10. An apparatus comprising:
an amplifier comprising at least one transistor;
a replica circuit comprising at least one transistor replicating the at least one transistor in the amplifier; and
a feedback circuit coupled to the amplifier and the replica circuit and to sense a first voltage in the amplifier, to sense a second voltage in the replica circuit, and to generate a bias voltage for the amplifier based on the first and second voltages.

11. The apparatus of claim 10, the feedback circuit comprising
a filter to receive and filter the first voltage and provide a third voltage, and
a sensing circuit to receive the second and third voltages and generate the bias voltage for the gate of the first transistor.

12. The apparatus of claim 10, the amplifier comprising first and second transistors coupled in a stack, the replica circuit comprising third and fourth transistors coupled in a stack, the first voltage is a drain voltage of the first transistor, the second voltage is a drain voltage of the third transistor, and the bias voltage is applied to a gate of the first transistor.

13. The apparatus of claim 12, the second and fourth transistors receive a second bias voltage, the third transistor receives a third bias voltage, and the second and third bias voltages provide a target bias current for the third and fourth transistors in the replica circuit.

14. A method of adjusting bias current, comprising:
obtaining a measurement of a voltage across an inductor coupled to at least one transistor in an amplifier, or a current through a current mirror formed with one of the at least one transistor in the amplifier, or a gate-to-source voltage, Vgs, of one of the at least one transistor in the amplifier, or a voltage in a replica circuit replicating the amplifier, or a current applied to the amplifier with a switched mode power supply (SMPS) disabled; and
generating at least one bias voltage for the at least one transistor in the amplifier based on the measurement to obtain a target bias current for the amplifier.

15. The method of claim 14, the generating the at least one bias voltage comprising
determining a measured bias current for the amplifier based on the Vgs voltage of one of the at least one transistor in the amplifier, and
generating the at least one bias voltage based on the measured bias current and the target bias current for the amplifier.

16. The method of claim 14, the generating the at least one bias voltage comprising generating the at least one bias voltage based on the Vgs voltage of one of the at least one transistor in the amplifier and a target Vgs voltage.

17. The method of claim 14, the generating the at least one bias voltage comprising
obtaining a second measurement of a Vgs voltage of one of at least one transistor in the replica circuit, and
generating the at least one bias voltage for the at least one transistor in the amplifier based further on the second measurement to obtain the target bias current for the amplifier.

18. The method of claim 14, the generating the at least one bias voltage comprising
sensing a voltage in the amplifier, and
generating a bias voltage for the amplifier based on the voltage in the replica circuit and the voltage in the amplifier using a feedback loop.

19. An apparatus for bias adjustment, comprising:
means for obtaining a measurement of a voltage across an inductor coupled to at least one transistor in an amplifier, or a current through a current minor formed with one of the at least one transistor in the amplifier, or a gate-to-source voltage, Vgs, of one of the at least one transistor in the amplifier, or a voltage in a replica circuit replicating the amplifier, or a current applied to the amplifier with a switched mode power supply (SMPS) disabled; and
means for generating at least one bias voltage for the at least one transistor in the amplifier based on the measurement to obtain a target bias current for the amplifier.

* * * * *